United States Patent [19]
Tamamura et al.

[11] Patent Number: 5,989,339
[45] Date of Patent: *Nov. 23, 1999

[54] MBE SYSTEM AND SEMICONDUCTOR DEVICE FABRICATED, USING SAME

[75] Inventors: Koshi Tamamura, Tokyo; Hironori Tsukamoto; Masao Ikeda, both of Kanagawa, all of Japan

[73] Assignee: Sony Corporation, To-yo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/527,456

[22] Filed: Sep. 13, 1995

[30] Foreign Application Priority Data

Sep. 4, 1994 [JP] Japan ................................. 6-246935

[51] Int. Cl.$^6$ ............................ C30B 23/02; C30B 29/48
[52] U.S. Cl. ........................ 117/107; 117/108; 117/956; 438/286; 438/289
[58] Field of Search ..................... 117/107, 108, 117/956; 437/126, 129; 438/286, 289

[56] References Cited

U.S. PATENT DOCUMENTS

| 4,681,773 | 7/1987 | Bean .................................. | 117/107 |
| 5,057,183 | 10/1991 | Tmomura et al. ................... | 117/956 |
| 5,450,813 | 9/1995 | Nishimura et al. ................. | 117/108 |
| 5,492,080 | 2/1996 | Ohkawa et al. ..................... | 117/956 |
| 5,548,137 | 8/1996 | Fan et al. ........................... | 257/191 |

FOREIGN PATENT DOCUMENTS 63-148617  6/1988  Japan .

OTHER PUBLICATIONS

Ozawa, et al., "The Growth of ZnMgSSe and Blue Laser Diodes", *Optoelectronics Devices and Technologies*, vol. 9, No. 2, pp. 193–204, Jun. 9, 1994, No. 2, Tokyo, Japan.
Gunshor, et al., "MBE of Wide Bandgap II–VI Compounds", *Journal of Crystal Growth*, vol. 99, No. 1/04, pp. 390–398, Jan. 1, 1990.
Patent Abstracts of Japan, vol. 7, No. 195 (C–183) [1340], Aug. 25, 1983 & JP–A–58 095695 (Fujitsu K.K.), Jun. 7, 1983.
Konagi, et al., "ZnSe—ZnTe Strained–Layer Superlattices: A Novel Material for the Future Optoelectronic Devices", *Journal of Crystal Growth*, vol. 86, No. 1–4, pp. 290–295, Jan. 1, 1988, Amsterdam, The Netherlands.
Yao, et al., "Molecular Beam Epitaxy of Zinc Chalcogenides", *Journal of Crystal Growth*, vol. 53, No. 2, pp. 423–431, May 1, 1981, Amsterdam, The Netherlands.
Derwent Abstract Accession No. 95–120145/16, Class U11 U12, JP 07–045538A (Hitachi Ltd.), Feb. 14, 1995.
Patent Abstracts of Japan, C–586, p. 115, JP 63–315594A (Nissin Electric co. Ltd.), Dec. 23, 1988.
Patent Abstracts of Japan, E–675, p. 133, JP 63–148617A (Hitachi Ltd), Jun. 21, 1988.

*Primary Examiner*—Robert Kunemund
*Attorney, Agent, or Firm*—Hill & Simpson

[57] ABSTRACT

A molecular beam epitaxy system having a plurality of chambers which contain at least a first chamber and a second chamber. The first chamber is used to form II–VI column compound semiconductor layers not containing Te. The second chamber is used to form II–VI column compound semiconductor layers containing at least Te. A semiconductor device having an ohmic characteristics can be fabricated without mixing Te into other layers.

1 Claim, 2 Drawing Sheets

MBE SYSTEM AND SEMICONDUCTOR DEVICE FABRICATED, USING SAME

BACKGROUND OF THE INVENTION

1. Field of the Invention

The present invention relates to a molecular beam epitaxy (MBE) system capable of forming II–VI column compound semiconductor layers and also to a method of fabricating an optical semiconductor device, using this MBE system.

2. Description of the Related Art

II–VI column compound semiconductors consisting of zinc selenide (ZnSe) or the like are applied to optical semiconductor devices such as laser diodes emitting blue-green light and light-emitting diodes.

Where a semiconductor device is fabricated, using these II–VI column compound semiconductors, the issue of ohmic contacts to p-type layer is still a subject, because it is difficult to obtain a high acceptor concentration. On the other hand, high p-type conductivity is obtained from zinc tellurium (ZnTe) more easily than from various other II–VI column compound semiconductors. Consequently, the use of ZnTe is essential for formation of the above-described ohmic contact.

An example of the optical semiconductor device which uses an ohmic contact made of ZnTe layer and emits blue-green light is shown in FIG. 3. This optical semiconductor device, 100, is a semiconductor laser. For example, this device uses a substrate 110 made from gallium arsenide (GaAs). A buffer layer of GaAs 121 is formed on the substrate 110. II–VI column compound semiconductor layers 120 are formed on the buffer layer 121. One example of this is described below.

Specifically, a buffer layer 122 of ZnSe and an n-type cladding layer 123 consisting, for example, of zinc magnesium sulfur selenide (znMgSSe) are successively formed over the GaAs buffer layer 121. Furthermore, an n-type guiding layer 124 made from zinc sulfur selenide (ZnSSe), an active layer 125 consisting, for example, of zinc cadmium selenide (ZnCdSe), and a p-type guiding layer 126 consisting of ZnSSe are stacked.

A p-type cladding layer 127 made from zinc magnesium sulfur selenide (ZnMgSSe:N) and a p-type layer 128 made from ZnSSe are successively formed over the p-type guiding layer 126.

A contact layer 129 consisting, for example, of a multi-layer film of ZnSe/ZnTe and having a superlattice structure and a cap layer 130 made from ZnTe are successively formed over the p-type layer 128. That is, the contact layer 129 and the cap layer 130 cooperate to form a p-type ohmic layer. Thus, the II–VI column compound semiconductor layers 120 are constituted.

Heretofore, the above-described II–VI column compound semiconductor layers 120 have been formed by MBE (molecular beam epitaxy) using an MBE system, for example. In the MBE process, the constituent elements of the II–VI column compound semiconductor layers 120 are evaporated in an ultra-high vacuum and epitaxially grown on the substrate 110, thus forming the layers 121–130.

However, tellurium (Te) is an element having a high vapor pressure and thus stagnant in nature. Therefore, where the substrate placed inside the chamber of the MBE system is isolated by a shutter from a Te cell connected with the chamber, if the temperature of the Te cell is elevated to a level at which growth is possible, then Te goes to the substrate through an unstraight route. For this reason, when the p-type cladding layer under the contact layer containing ZnTe is grown, Te is mixed into the p-type cladding layer. As a result, the hole concentration in the p-type cladding layer decreases. In consequence, the crystallinity deteriorates.

For example, when the hole concentration in the p-type cladding layer consisting of ZnMgSSe is about $3 \times 10^{17}$ cm$^{-3}$, if about 2% Te is mixed into the selenium (Se) in the p-type cladding layer, then the hole concentration drops to about $1 \times 10^{17}$ cm$^{-3}$. Also, recombination center due to Te in the n-type cladding layer is observed with photoluminescence (PL) at 77 K.

As a result, the fundamental emission characteristics are affected severely. For instance, the operation current or the threshold current of the formed optical semiconductor device increases, and the intensity of the emitted light decreases.

OBJECT AND SUMMARY OF THE INVENTION

It is an object of the invention to provide an MBE (molecular beam epitaxy) system and optical semiconductor device fabrication method capable of forming II–VI column compound semiconductor layers having a p-type layer for the ohmic contact without mixing Te into other layers.

The above-described object is achieved by an MBE system according to the present invention, the MBE system comprising a plurality of chambers including at least a first chamber and a second chamber. The first chamber is used to form II–VI column compound semiconductor layers not containing Te. The second chamber is employed to form II–VI column compound semiconductor layers containing at least Te.

Another MBE system according to the invention has a chamber to which a plurality of cells are connected. The cells contain at least one cell for evaporating Te. In this system, a gate valve or gate valves are mounted in the cell or cells for evaporating the Te and located on the side of the chamber.

A method of fabricating an optical semiconductor device according to the invention is a method of fabricating an optical semiconductor device by stacking II–VI column compound semiconductor layers. II–VI column compound semiconductor layers containing at least Te are formed, using any one of the MBE systems described above.

The MBE system forming a first embodiment of the invention comprises a first chamber for forming II–VI column compound semiconductor layers not containing Te and a second chamber for forming II–V column compound semiconductor layers containing at least Te. Therefore, the II–VI column compound semiconductor layers not containing Te and the II–VI column compound semiconductor layers containing Te are formed in their respective chambers. Consequently, Te is not mixed into the II–VI column compound semiconductor layers not containing Te.

In another embodiment of the invention, a gate valve or gate valves are mounted in the cell or cells for evaporating Te and located on the side of a chamber. Therefore, if the gate valve is closed, the ambient in the cell or cells is completely isolated from the ambient inside the chamber. As a result, when the gate valve is closed, Te supplied into the cell or cells is completely confined in the cells and does not enter the chamber. When the gate valve is opened, the ambient in the cell or cells is placed in communication with the ambient inside the chamber. Consequently, when the compound semiconductor layers not containing Te are formed, Te is not mixed into these layers.

In a further embodiment of the invention, II–VI column compound semiconductor layers containing Te are formed by using any one of the MBE systems described above without mixing Te into the other layers not containing Te.

DETAILED DESCRIPTION OF THE PREFERRED EMBODIMENTS

The preferred embodiments of the present invention are hereinafter described in detail with reference to the accompanying drawings.

Figure 1:
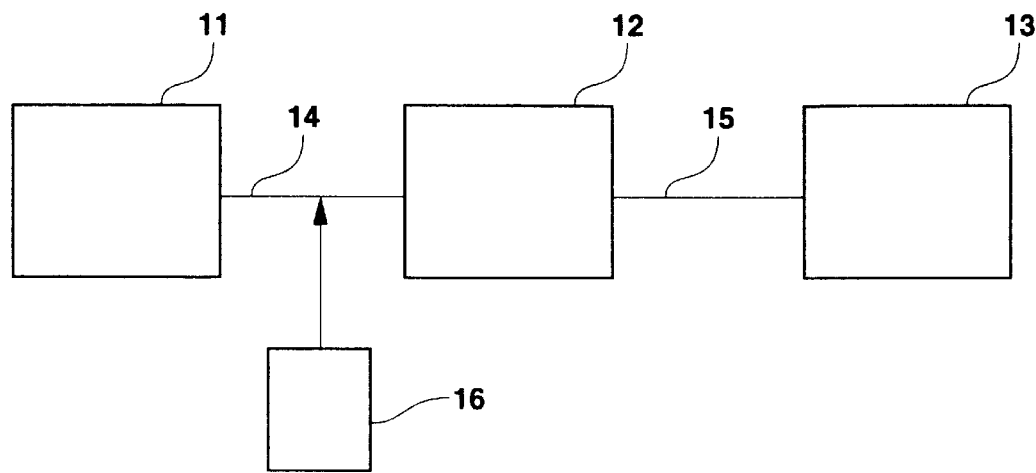
FIG. 1 is a block diagram of an MBE system forming a first embodiment of the invention.

FIG. 1 is a schematic block diagram showing the configuration of a first embodiment of the present invention. As shown, an MBE system 1 comprises a plurality of chambers including at least a chamber 11, a first chamber 12, and a second chamber 13.

The chamber 11 is used to epitaxially grow III–V column compound semiconductor layers such as GaAs. The first chamber 12 is used to epitaxially grow II–VI column compound semiconductor layers not containing Te, such as ZnSe, ZnMgSSe, ZnSSe, and ZnCdSe. The second chamber 13 is employed to epitaxially grow II–VI column compound semiconductor layers containing at least Te such as ZnTe.

In this example, the first chamber 12 is placed in the center. The chamber 11 and the second chamber 13 are connected to the first chamber. A chamber 16 for introducing a substrate is connected to an interconnection path 14 between the chamber 11 and the first chamber 12. For example, gate valves (not shown) are mounted respectively in the interconnection path 14 and in an interconnection path 15 between the first chamber 12 and the second chamber 13 to hermetically isolate the chambers from each other.

In the above-described MBE system 1, III–V column compound semiconductor layers are formed in their dedicated chamber 11. II–VI column compound semiconductor layers not containing Te are formed in their dedicated first chamber 12. Compound semiconductor layers containing at least Te are formed in their dedicated second chamber 13. Therefore, Te is prevented from being mixed into the III–V column compound semiconductor layers or into the II–VI column compound semiconductor layers not containing Te. Consequently, II–VI column compound semiconductor layers which do not contain Te and have p-type and n-type layers of improved crystallinity can be formed.

Moreover, in the second chamber 13, II–VI column compound semiconductor layers having p-type ohmic characteristics can be formed.

Accordingly, if the MBE system 1 is used, an optical semiconductor device having lower operation current, lower oscillation current, and higher emission intensity (i.e., having improved fundamental emission characteristics) compared with the prior art device can be realized.

Figure 3:
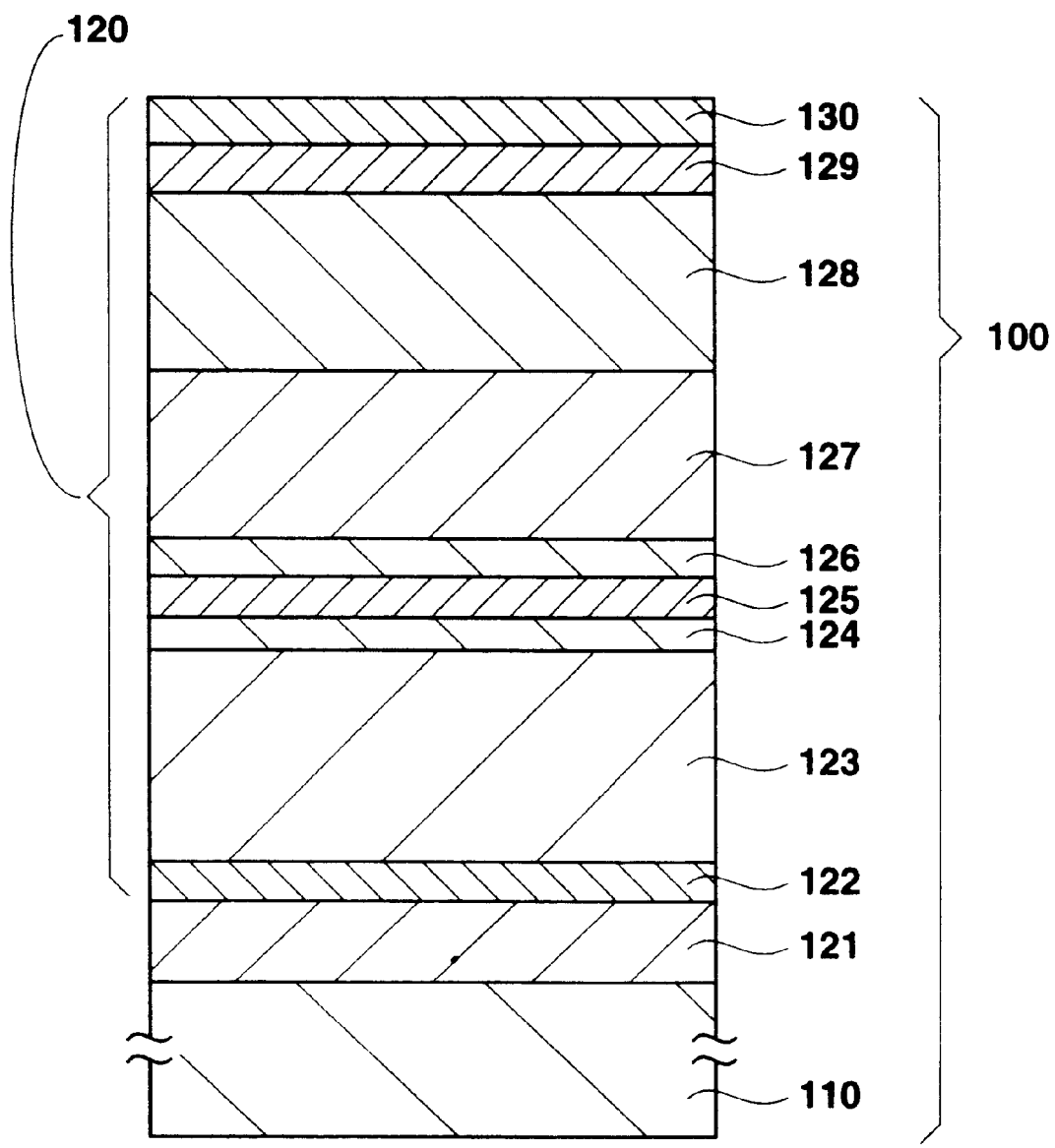
FIG. 3 is a cross-sectional view of an optical semiconductor device fabricated, using an MBE system forming a third embodiment of the invention.

The case in which the present optical semiconductor device fabrication method uses the above-described MBE system 1 is now described as an example. In this case, the semiconductor laser emitting blue-green light as already described in connection with FIG. 3 is fabricated as the optical semiconductor device.

First, a substrate 110 of GaAs is supplied from the substrate-introducing chamber 16 into the chamber 11. The substrate 110 is heat-treated in the chamber 11. Then, a buffer layer 121 of GaAs is epitaxially grown on the substrate 110. At this time, the buffer layer 121 is formed to a film thickness of about 0.3 $\mu$m, for example.

Then, the substrate 110 is moved into the first chamber 12 via the interconnection path 14. Thereafter, the II–VI column compound semiconductor layers 120 not containing Te (i.e., from a buffer Layer 122 to a p-type cladding layer 128) are epitaxially grown within the first chamber 12.

More specifically, the buffer layer 122 of ZnSe, an n-type cladding layer 123 of ZnMgSSe, an n-type guiding layer 124 of ZnSSe, an active layer 125 of ZnCdSe, a p-type guiding layer 126 of ZnSSe, a p-type cladding layer 127 of ZnMgSSe, and the p-type layer 128 of ZnSSe are successively epitaxially grown over the buffer layer 121.

At this time, these layers 122–128 are so grown that the following film thicknesses are obtained. The film thickness of the buffer layer 122 is about 200 Å. The film thickness of the n-type cladding layer 123 is about 0.8 $\mu$m. The film thickness of the n-type guiding layer 124 is about 600 Å. The film thickness of the active layer 125 is about 60 Å. The film thickness of the p-type guiding layer 126 is about 600 Å. The film thicknesses of the p-type cladding layer 127 and p-type layer 128 are about 0.6 $\mu$m. Simultaneously with epitaxial growth of the n-type cladding layer 123 and of the n-type guiding layer 124, they are doped with chlorine (Cl), for example. Also, simultaneously with epitaxial growth of the p-type guiding layer 126 and of the p-type cladding layer 127 and p-type layer 128, they are doped with nitrogen (N), for example.

Then, the substrate 110 is moved into the second chamber 13 through the interconnection path 15. In the second chamber 12, the contact layer 129 consisting of a multilayer film of ZnSe/ZnTe and the cap layer 130 of ZnTe are successively grown. At this time, the contact layer 129 is formed to a film thickness of about 150 Å, for example. The cap layer 130 is grown to a film thickness of about 700 Å.

In this method, the contact layer 129 containing Te and the cap layer 130 are formed in the second chamber 13 which is used only for formation of II–VI column compound semiconductor layers containing at least Te. For this reason, the II–VI column compound semiconductor layers 120 excluding the contact layer 129 and the cap layer 130 can be formed without mixing Te into those layers. As a result, the p-type cladding layer 127 and p-type layer 128 have hole concentrations not decreased and improved crystallinity. Also, the n-type cladding layer 123 has good crystallinity.

Furthermore, the contact layer 129 and the cap layer 130 formed in the second chamber 13 can be formed so as to contain Te and so p-type ohmic characteristics can be obtained.

Accordingly, in the above example, a semiconductor device whose fundamental light emission characteristics such as operation current, threshold current, and emission intensity are improved and which has improved life characteristics can be fabricated.

Figure 2:
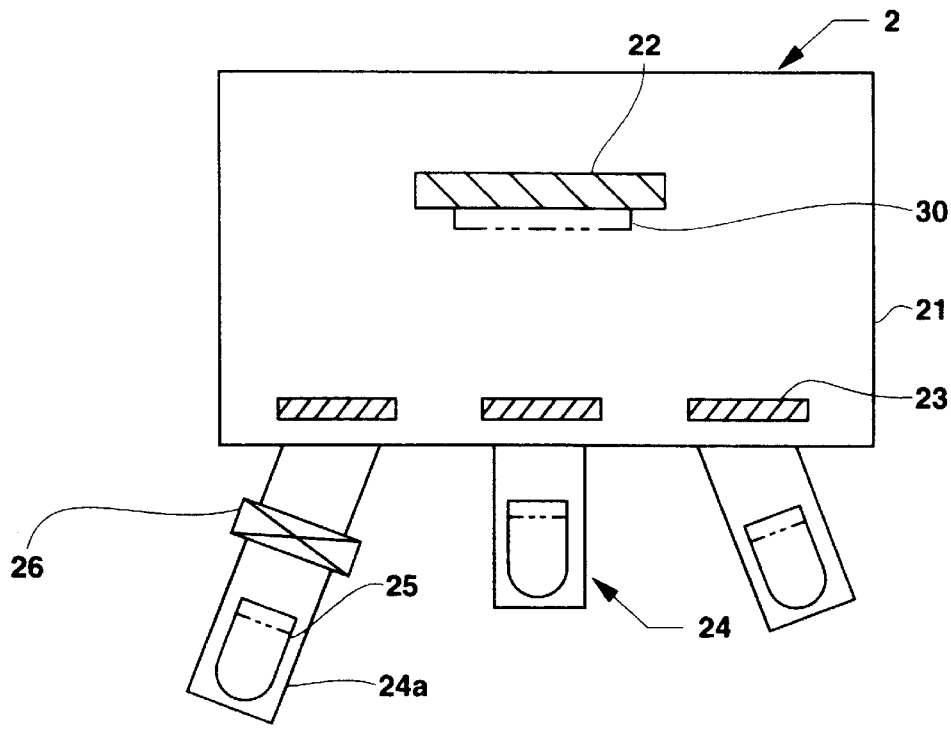
FIG. 2 is a side elevation partially in cross section of an MBE system forming a second embodiment of the invention.

A second embodiment of the present invention is next described by referring to the schematic view of FIG. 2. As shown, this MBE system 2 has a chamber 21 used for fabrication of a II–VI column compound semiconductor. A plurality of cells 24 are connected to the chamber. A holder 22 for holding a substrate 30 is mounted inside the chamber 21. Shutters 23 which can be opened and closed are mounted between their respective cells 24 and the holder 22.

The plural cells 24 are provided for epitaxially grown constituent elements, respectively. These cells 24 include at least one cell 24a (hereinafter referred to as the cell used only for Te) for evaporating Te. A constituent element put in a crucible 25, for example, is supplied into each cell 24.

A gate valve 26 which is a feature of the present invention is mounted in the cell 24a used only for Te and located on the side of the chamber 21. In this example, a chamber (not shown) for formation of III–V column compound semiconductors is connected with the chamber 21 used for formation of II–VI column compound semiconductors.

In this MBE system 2 constructed in this way, when the gate valve 26 is closed, the ambient inside the cell 24a used only for Te is completely isolated from the ambient inside the chamber 21. As a result, when the gate valve 26 is closed, Te supplied into the cell 24a used only for Te is completely confined within the cell 24a used only for Te. Therefore, the Te does not enter the chamber 21.

When the gate valve 26 is opened, the ambient inside the cell 24a used only for Te is placed in communication with the ambient inside the chamber 21. Therefore, when the gate valve 26 is opened, Te supplied into the cell 24a used only for Te enters the chamber 21. At this time, if the substrate 30 is held in the holder 22, a beam of Te reaches the surface of the substrate 30. Also, when the gate valve 26 is open, the crucible 25 supplied into the cell 24a used only for Te can be moved into that portion of the cell 24a used only for Te which is located on the side of the chamber 21.

Accordingly, in the MBE system 2 of this example, Te is prevented from being mixed into II–VI column compound semiconductor layers not containing Te when they are formed. Also, p-type ohmic characteristics consisting of II–VI column compound semiconductor layers containing Te can be formed.

Consequently, II–VI column compound semiconductor layers which have p-type and n-type layers of improved crystallinity and which contain no Te can be formed. Therefore, an optical semiconductor device whose fundamental light emission characteristics have been improved and which has improved life characteristics can be fabricated.

A third embodiment is described now. In this embodiment, the optical semiconductor device fabrication method using the above-described MBE system 2 is employed to fabricate a semiconductor laser emitting blue-green light as the optical semiconductor device described in connection with FIG. 3.

First, a substrate 110 of GaAs is supplied into a chamber used for formation of III–V column compound semiconductors. The substrate 110 is heat-treated in this chamber. Then, a buffer layer 121 of GaAs is epitaxially grown on the substrate 110.

Then, the substrate 110 is moved into the chamber 21 which is used for formation of II–VI column compound semiconductors. At this time, the gate valve 26 mounted in the cell 24a used only for Te is closed. As a result, Te supplied into the cell 24a used only for Te is isolated. Subsequently, the II–VI column compound semiconductor layers 120 are epitaxially grown from the buffer layer 122 not containing Te to the p-type cladding layer 128 in the chamber 21.

Immediately after the end of the growth of the p-type layer 128, the gate valve 26 is opened. Also, the crucible 25 holding Te is moved into a position close to the positions of the other crucibles 25 supplied into the other cells 24. The contact layer 129 consisting of a multilayer film of ZnSe/ZnTe and the cap layer 130 of ZnTe are successively epitaxially grown on the p-type layer 128.

In this method, when the gate valve 26 which is mounted in the cell 24a used only for Te and located on the side of the chamber 21 is closed, the II–V column compound semiconductor layers 120 are epitaxially grown from the buffer layer 122 not containing Te to the p-type layer 128. As a result, these layers can be formed from the buffer layer 122 to the p-type layer 128 without mixing Te into them. In consequence, the p-type cladding layer 127, p-type layer 128 and n-type cladding layer 123 having improved crystallinity are obtained.

When the gate valve 26 is open, the contact layer 129 and the cap layer 130 are formed. The result is that the contact layer 129 and the cap layer 130 are grown so as to contain Te. Hence, these layers 129 and 130 have p-type ohmic characteristics.

Accordingly, in the above example, an optical semiconductor device whose fundamental light emission characteristics have been improved and which has improved life characteristics can be fabricated. In the example described above, a semiconductor laser has been described as an example of optical semiconductor device. It is to be noted that the invention is not limited to this.

As described thus far, in the first embodiment of the invention, a second chamber used only for formation of compound semiconductor layers containing at least Te is provided independent of a first chamber. Therefore, III–V column compound semiconductor layers and II–V column compound semiconductor layers not containing Te can be formed without mixing Te into them. Consequently, II–V column compound semiconductor layers having p-type layers whose hole concentration is prevented from decreasing and which have improved crystallinity can be formed, the II–V column compound semiconductor layers containing no Te. Furthermore, in the second chamber, II–V column compound semiconductor layers having p-type ohmic characteristics can be formed.

In the second embodiment of the invention, a gate valve is mounted in a cell for evaporating Te and located on the side of the chamber, unlike other cells. Therefore, II–V column compound semiconductor layers not containing Te can be formed without mixing Te into them by opening and closing the gate valve. Alternatively, II–V column compound semiconductor layers containing Te can be formed.

In the third embodiment of the invention, II–V column compound semiconductor layers containing Te can be formed without mixing Te into other layers. Therefore, an optical semiconductor device in which the hole concentrations of the other p-type layers not containing Te are prevented from decreasing and in which the crystallinity of n-type layers are not deteriorated can be manufactured.

Accordingly, an optical semiconductor device having lower operation current, lower threshold current, higher emission intensity, and improved life characteristics compared with the prior art device can be realized.

What is claimed is:

1. A method for making a light emitting device, consisting essentially of the following sequential steps forming successively in order an n-type cladding layer, an active layer and a p-type cladding layer comprising II–VI compounds not containing Te on a semiconductor substrate by molecular bean epitaxy in a first chamber;

moving the substrate from the first chamber to a second chamber hermetically isolated from said first chamber; and thereafter, in the second chamber forming successively in order a contact layer and a cap layer each comprising a II–VI compound containing Te on said p-type cladding layer in said second chamber by molecular beam epitaxy to provide said light emitting device, said contact layer comprises alternating II–VI compound semiconductor layers of ZnSe and ZnTe, and said cap layer comprises ZnTe and wherein the light emitting device is an optical semiconductor laser emitting light.

* * * * *